United States Patent [19]

Diller et al.

[11] Patent Number: 4,754,205

[45] Date of Patent: Jun. 28, 1988

[54] OSCILLOSCOPE HAVING AUXILIARY DISPLAY OF A LABELLED CURSOR

[75] Inventors: Calvin D. Diller, Hillsboro; Douglas C. Stevens, Portland, both of Oreg.

[73] Assignee: Tektronix, Inc., Beaverton, Oreg.

[21] Appl. No.: 909,972

[22] Filed: Sep. 22, 1986

[51] Int. Cl.$^4$ .................. G01R 13/30; H01J 29/70; G09G 3/02

[52] U.S. Cl. ..................... 315/377; 315/367; 340/709

[58] Field of Search .............. 315/367, 377; 340/734, 340/721, 720, 736, 789, 790, 347 DA, 709; 324/404, 121 R; 328/189

[56] References Cited

U.S. PATENT DOCUMENTS 3,872,461 3/1975 Jarosik et al. ............... 340/736
4,400,780 8/1983 Nagao et al. ............... 340/734
4,628,254 12/1986 Bristol ............... 324/121 R Primary Examiner—Theodore M. Blum
Assistant Examiner—Gregory C. Issing
Attorney, Agent, or Firm—John Smith-Hill

[57] ABSTRACT

An instrument for providing a principal display representing the variation of a first quantity as a function of a second quantity, comprises a display screen. A visually distinct dot is generated on the display screen and is deflected along one of two orthogonal axes in dependence upon the value of the first quantity and along the other axis in dependence upon the value of the second quantity. The dot is additionally deflected to selected positions along the two axes to generate an auxiliary display of a marker and of an information-conveying character adjacent the marker. The position of the auxiliary display is adjustable along at least one of the axes.

38 Claims, 4 Drawing Sheets

OSCILLOSCOPE HAVING AUXILIARY DISPLAY OF A LABELLED CURSOR

This invention relates to an oscilloscope having an auxiliary display of a labelled cursor.

BACKGROUND OF THE INVENTION

A conventional cathode ray oscilloscope is used to provide a display on the screen of a cathode ray tube of the waveform of an input signal. It is also conventional for the oscilloscope to display one or more cursors representing selected signal magnitude levels or the time of occurrence of selected events. In addition, conventional oscilloscopes display alphanumeric text information, typically along the upper and lower edges of the CRT screen, representing the operating mode and settings of the oscilloscope. This text information might include information relating to the value of the parameter represented by a cursor or by the distance between two cursors. For example, where the cursor represents signal magnitude, e.g. voltage, the text information might indicate the value of the signal magnitude, relative to a datum level that is represented by the position of the cursor, and if two cursors are displayed at positions representing different magnitude values, the text information might indicate the difference between the values represented by the cursor positions respectively. Where a cursor represents time, the text information might indicate the interval between a trigger event and the time represented by the cursor position, and where two cursors are displayed the text information might indicate the duration represented by the distance between the cursors.

Using a conventional oscilloscope that displays a waveform signal, text information and one or more cursors, it is necessary for the operator to shift attention between the cursors and the text information in order to interpret the significance of features of the waveform.

SUMMARY OF THE INVENTION

A preferred embodiment of the present invention is an instrument for providing a principal display representing the variation of a first quantity as a function of a second quantity. The instrument comprises a display screen and means for generating a visually distinct dot on the display screen. First deflection means receive a signal representative of the first quantity and cause the dot to be deflected along a first of two orthogonal axes in dependence upon the value of the first quantity. Second deflection means receive a signal representative of the second quantity and cause the dot to be deflected along a second of the two orthogonal axes in dependence upon the value of the second quantity. Cursor means apply signals to the first and second deflection means for causing the deflection means additionally to deflect the dot to selected positions along the first and second axes to generate an auxiliary display of a marker and of an information-conveying character adjacent the marker. The position of the auxiliary display is adjustable along at least one of the axes.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION

Figure 1:
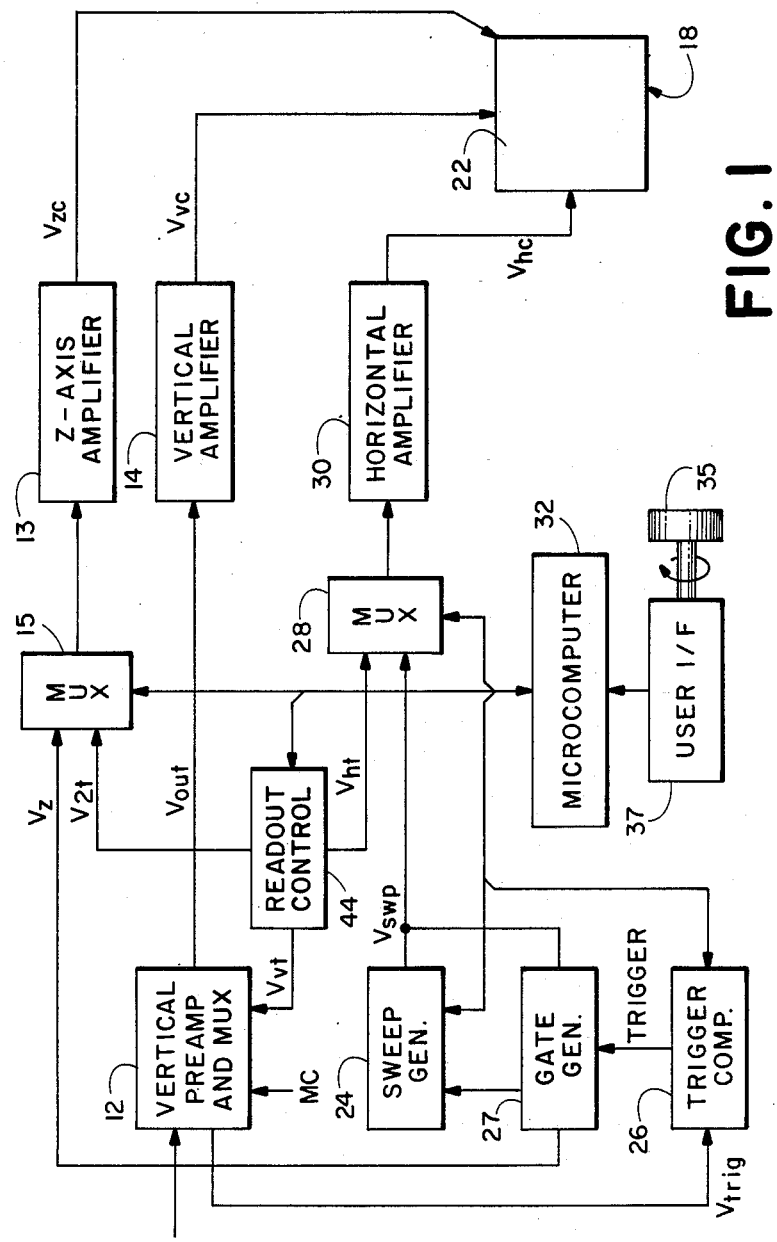
FIG. 1 is a block diagram of an oscilloscope embodying the present invention.

Referring to FIG. 1 depicting in block diagram form a real time analog oscilloscope 10 embodying the present invention, oscilloscope 10 includes a vertical preamplifier and multiplexer system 12. In one operating mode, vertical preamplifier and multiplexer system 12 produces an output signal Vout in proportion to an input signal Vin generated by a device under test. Vout is applied as input to a vertical amplifier 14 producing a vertical control signal Vvc proportional to Vout, Vvc being applied to the vertical deflection plates of a cathode ray tube (CRT) 18 for controlling the vertical position of the point on the screen 22 of CRT 18 that is addressed by the CRT's electron beam. If the electron beam is unblanked, the point is illuminated and a light dot is created; if the beam is blanked, the point is not illuminated. A trigger system includes a trigger comparator 26 and a gate generator 27. Trigger comparator 26 compares an input trigger source signal Vtrig, such as a signal generated by vertical preamplifier and multiplexer system 12 and representative of the magnitude of the input signal Vin, with a predetermined trigger level and responds to a trigger event, defined by a selected relationship between Vtrig and the trigger level, by applying a trigger signal to gate generator 27. Gate generator 27 generates a sweep gate signal at a predetermined time following receipt of the trigger signal. The sweep gate signal is applied to a sweep generator 24, which responds to the sweep gate signal by producing a sweep signal Vswp which increases linearly with time (sweeps) from a predetermined starting level and continues as long as sweep generator 24 detects assertion of the sweep gate signal. The Vswp signal is fed back to gate generator 27, which continues to assert the sweep gate signal until Vswp reaches a predetermined ending level. Vswp is also applied through a multiplexer 28 to an input of a horizontal amplifier 30 producing a horizontal control signal Vhc that is applied to the horizontal deflection plates of CRT 18. The manner of operation of the trigger system is fully described in co-pending application Ser. No. 06/908,551 filed Sept. 17, 1986, the disclosure of which is hereby incorporated by reference herein.

The intensity of the electron beam is controlled by the magnitude of an output signal Vzc of a "Z-axis" amplifier 13, Vzc being proportional to the output of a multiplexer 15. A voltage Vz produced by gate generator 27 provides one input to multiplexer 15 while an output signal Vzt produced by a readout control circuit 44 provides an additional input to multiplexer 15. The readout control circuit 44 also produces an output voltage Vht provided as an alternative input to horizontal amplifier 30 through multiplexer 28, and an output voltage Vvt that is applied to vertical preamplifier and multiplexer system 12.

A microcomputer (MC) 32 controls the switching positions of multiplexers 15 and 28, sets the slew rate of the sweep signal Vswp supplied by sweep generator 24 in accordance with a signal received from a user interface 37, and determines the trigger level utilized in trigger comparator 26. Microcomputer 32 transmits control signals to vertical preamplifier and multiplexer system 12 for determining whether Vout is to be controlled by Vin or Vvt, and if by Vin, the ratio of Vout to Vin (the preamplifier gain). Microcomputer 32 also communicates with readout control circuit 44 for purposes described hereinbelow. A knob 35, mounted on the front panel of the oscilloscope, supplies input to the user interface 37 and causes the interface to provide data to the microcomputer 32 indicating the direction and amount of knob rotation. The microcomputer utilizes the knob rotation data to adjust an operating parameter which controls the display of a cursor on screen 22 in a manner described hereinbelow.

Figure 2:
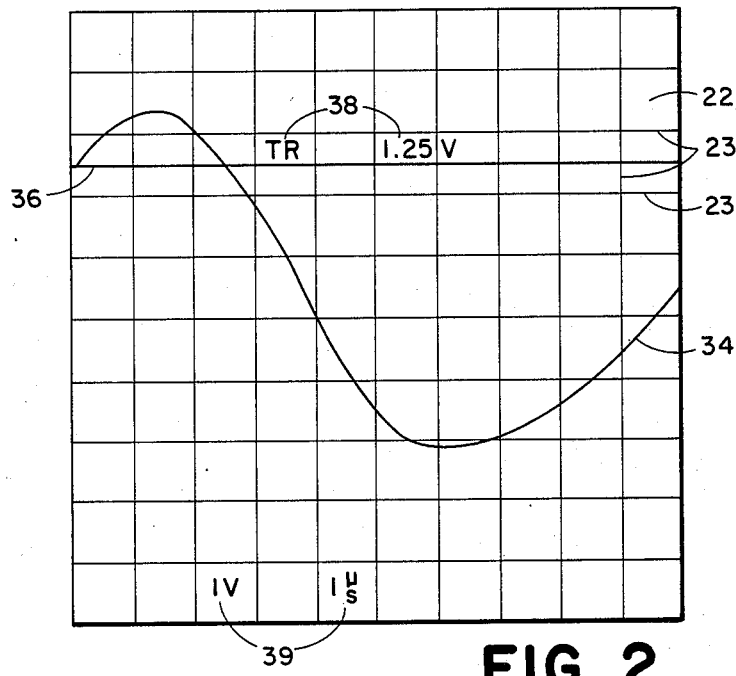
FIG. 2 illustrates a typical display that might be provided by the FIG. 1 oscilloscope.

FIG. 2 shows a typical display which may be produced on oscilloscope screen 22. The display includes as its principal feature a waveform 34. The screen 22 is segmented by a grid 23 superimposed on the screen so as to permit an operator to gauge the vertical and horizontal displacement of any point on waveform 34 from a reference point on the grid in terms of vertical and horizontal grid divisions. The display also includes as an auxiliary feature a cursor 36 and cursor text 38. The cursor 36 is displayed in the form of a horizontal line extending across screen 22, having a vertical position controlled by cursor position data supplied as input to the readout control circuit 44 by microcomputer 32. The nature of the cursor text 38 is controlled by cursor text data supplied to readout control circuit 44 by microcomputer 32.

In the example shown in FIG. 2, the cursor text data includes label data and magnitude data. The label data indicates the parameter selected for representation by the cursor, and the magnitude data indicates the value of that parameter. In particular, the magnitude data indicates a voltage represented by the vertical position of the cursor. The relative positions of the cursor and the cursor text are fixed. If the value of the parameter represented by the cursor changes, both the cursor position data and the magnitude data change to reflect the change in value. Thus, the position of the cursor and nature of the magnitude portion of the cursor text change, but the cursor text remains in the same position relative to the cursor. As shown, the label data TR indicates that the cursor is at the trigger level. If the operator adjusts the trigger level through the user interface, the magnitude data and the position of the cursor will be changed but the label data will remain the same. Alternatively, the cursor might, for example, bear the label data +PK (or −PK), indicating that the cursor is at the positive (or negative) peak of the displayed waveform 34, as calculated by microcomputer 32 in the manner described in the co-pending application. When the positive (or negative) peak level of the waveform changes, the position of the cursor changes. As another possibility, the label data might be GRD, indicating that the position of the cursor represents the level of the signal ground relative to other features of the signal. In this case, which is further described in the co-pending application, the vertical position of the cursor would be adjustable in response to a change in the vertical position control of the user interface, but otherwise would normally remain fixed relative to the horizontal grid lines. Alternatively, or in addition, a vertical cursor, representing a point in time, can be displayed. In the preferred embodiment of the invention, no cursor text is associated with the vertical cursor, but methods for displaying cursor text associated with a vertical cursor are nevertheless described below.

The display also includes, as a third feature, screen text 39. The screen text remains stationary within the screen area when the vertical position of the waveform 34 or the cursor 36 changes. The screen text represents the operating mode of the oscilloscope, and the screen text shown in FIG. 2 indicates that the vertical sensitivity control is set to 1.0 v/div and that the sweep rate is set to 1 $\mu$s/div. The nature of the screen text is controlled by screen text data supplied to readout control circuit 44 by microcomputer 32.

Microcomputer 32 has two modes of operation, namely a waveform display mode and a cursor and text display mode. In the waveform display mode, the electron beam of CRT 18 is used to create or refresh the display of waveform 34 on screen 22. In this mode, microcomputer 32 switches multiplexers 15 and 28 so that the Vswp signal supplied by sweep generator 24 and the Vz signal produced by gate generator 27 during the period of assertion of the sweep gate signal determine the magnitudes of the beam's horizontal and intensity control signals (Vhc and Vzc). The magnitude of the vertical control signal Vvc is determined by the Vout signal provided by vertical preamplifier and multiplexer system 12 according to the magnitude of Vin. In the cursor and text display mode, the beam is used to create or refresh the display of cursor 36 and cursor text 38 and the display of screen text 39. Microcomputer 32 switches multiplexers 15 and 28 so that the Vht and Vzt outputs of readout control circuit 44 determine the magnitudes of the beam's horizontal and intensity control signals. The magnitude of the beam's vertical control signal Vvc is determined by the Vout signal provided by vertical preamplifier and multiplexer system 12, but the magnitude of Vout is not determined by Vin but is determined by the Vvt signal provided by readout control circuit 44. When the cursor and cursor text display is being created or refreshed, the Vvt signal is generated in response to the cursor position data and cursor text data supplied by microcomputer 32, and when the screen text display is being created or refreshed, the Vvt signal is generated in response to screen text data supplied by microcomputer 32. Oscilloscope 10 of FIG. 1 thus creates or refreshes the display of FIG. 2 by first controlling the beam according to Vin, Vswp and Vz so that the beam sweeps at least partially across the screen, thereby creating at least a segment of waveform 34. Microcomputer 32 then switches multiplexers 15 and 28 and transmits signals to vertical preamplifier and multiplexer system 12 which cause it to provide Vout according to the magnitude of the Vvt signal from readout control circuit 44, first according to the cursor position data and cursor text data from microcomputer 32 and then according to the screen text data from microcomputer 32. At low sweep speeds, the writing of waveform 34 is interrupted in order to allow the electron beam to provide a stable display of the cursor and cursor text and of the screen text. At high sweep speeds, a stable display can be obtained without its being necessary to interrupt the writing of waveform 34, and so the beam is deflected completely across the screen 22 in a single sweep when creating or refreshing the display of waveform 34.

When creating or refreshing the cursor and cursor text display and the screen text display, readout control circuit 44 produces a sequence of vertical output signal Vvt levels, a sequence of horizontal output signal Vht levels, and a sequence of Z-axis control signal Vzt levels, the sequences being synchronized so as to create the cursor and cursor text display and the screen text display on a pixel-by-pixel basis. The synchronized Vvt and Vht signal levels determine the vertical and horizontal position on the screen of each pixel making up cursor 36, cursor text 38 and screen text 39, while the Vzt signal levels determine whether or not each pixel is to be illuminated by the beam.

Thus by appropriately selecting cursor position data, cursor text data and screen text data supplied to readout control circuit 44, microcomputer 32 may initiate the display of cursor 36, cursor text 38 and screen text 39 superimposed over waveform display 34. The ability to vertically position the horizontal cursor 36 is useful, for example, in providing a graphical representation of the trigger level that the trigger system 26 utilized to initiate the sweep gate signal. The cursor position and cursor text may also be utilized to display the value of other voltages to be determined by the oscilloscope, in the manner described in detail in the co-pending application. For example, in a voltage measurement mode, the horizontal cursor may be used to measure the voltage level of a waveform feature by positioning the cursor at the level of that feature using knob 35. In this situation, microcomputer 32 adjusts the cursor position data in response to the rotation of knob 35 whereby an operator may adjust the vertical position of the cursor on the screen by rotating knob 35 so that it intersects the displayed waveform at any selected level. The cursor text includes a measure of the voltage level V of the cursor. The microcomputer computes this voltage level V. Therefore, in the voltage measurement mode the operator can easily determine the magnitude of the input signal at any point by positioning the cursor to intersect the waveform at the corresponding point.

Figure 3:
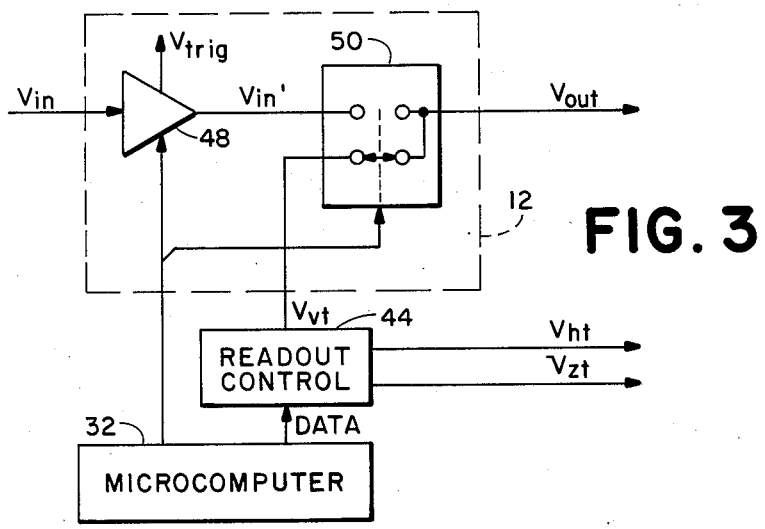
FIG. 3 is a block diagram of the vertical preamplifier and multiplexer system shown in FIG. 1, FIGS. 4, 5 and 6 are schematic representations of characters that may be displayed on the screen of the FIG. 1 oscilloscope.

Referring to FIG. 3, the magnitude of the output signal Vout produced by vertical preamplifier and multiplexer system 12 may be controlled by the input signal Vin generated by the device under test or by the voltage Vvt produced by readout control circuit 44. The input signal Vin is connected to the input of a vertical channel preamplifier 48 which produces an output voltage Vin' and the trigger source signal Vtrig, each of magnitude varying with the voltage of input signal Vin. Signals Vin' and Vvt are applied to switch 50, the switching position of which is controlled by microcomputer 32. Whichever signal (Vin' or Vvt) is selected by switch 50 is applied to vertical amplifier 14 as the vertical channel output voltage Vout.

To form the waveform display 34 of FIG. 2, microcomputer 32 sets switch 50 to select Vin' and sets multiplexers 15 and 28 of FIG. 1 to connect Vz and Vswp as the inputs to Z-axis amplifier 13 and horizontal amplifier 30 respectively. To bring about display of cursor 36, cursor text 38 and screen text 39, microcomputer 32 sets switch 50 to select Vvt and sets multiplexers 15 and 28 of FIG. 1 to couple the output signals Vzt and Vht of readout control circuit 44 as the inputs to Z-axis amplifier 13 and horizontal amplifier 30 respectively.

Figure 4:
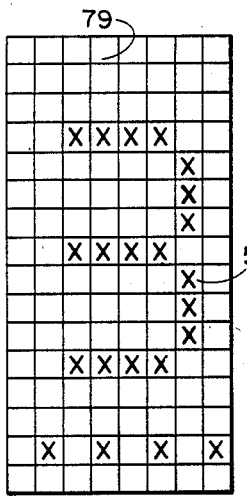
Figure 5:
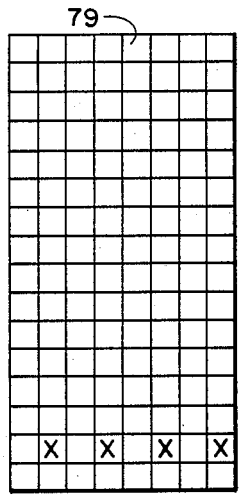

Readout control circuit 44 produces the display of the cursor 36 and the cursor text 38 of FIG. 2 by causing a line of thirty-two characters of the type shown in FIGS. 4 and 5 to be displayed across the screen. Each character is defined within a character cell that is sixteen pixels high and eight pixels wide, each pixel being represented in FIGS. 4 and 5 by a small square such as square 79. Some pixels (those identified by an "X" as in square 81) are illuminated by the electron beam to form the shape of an underlined number or a letter as shown in FIG. 4, or to form a simple underline as shown in FIG. 5. The characters are selected and arranged in the row so that the underlines form cursor 36 of FIG. 2 and so that the letters and numbers form cursor text 38 of FIG. 2.

Figure 6:
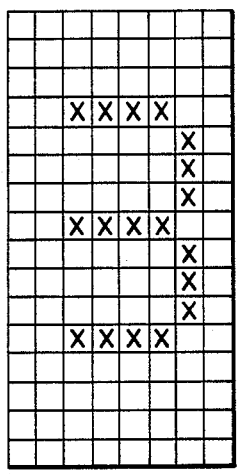

Oscilloscope 10 is able to display screen text in up to eight lines each containing up to thirty-two characters. The possible positions of the lines of screen text are fixed with reference to grid 23. The screen text characters are generated in similar manner to the cursor characters, by illuminating selected pixels, but the characters are not underlined (FIG. 6).

Figure 7:
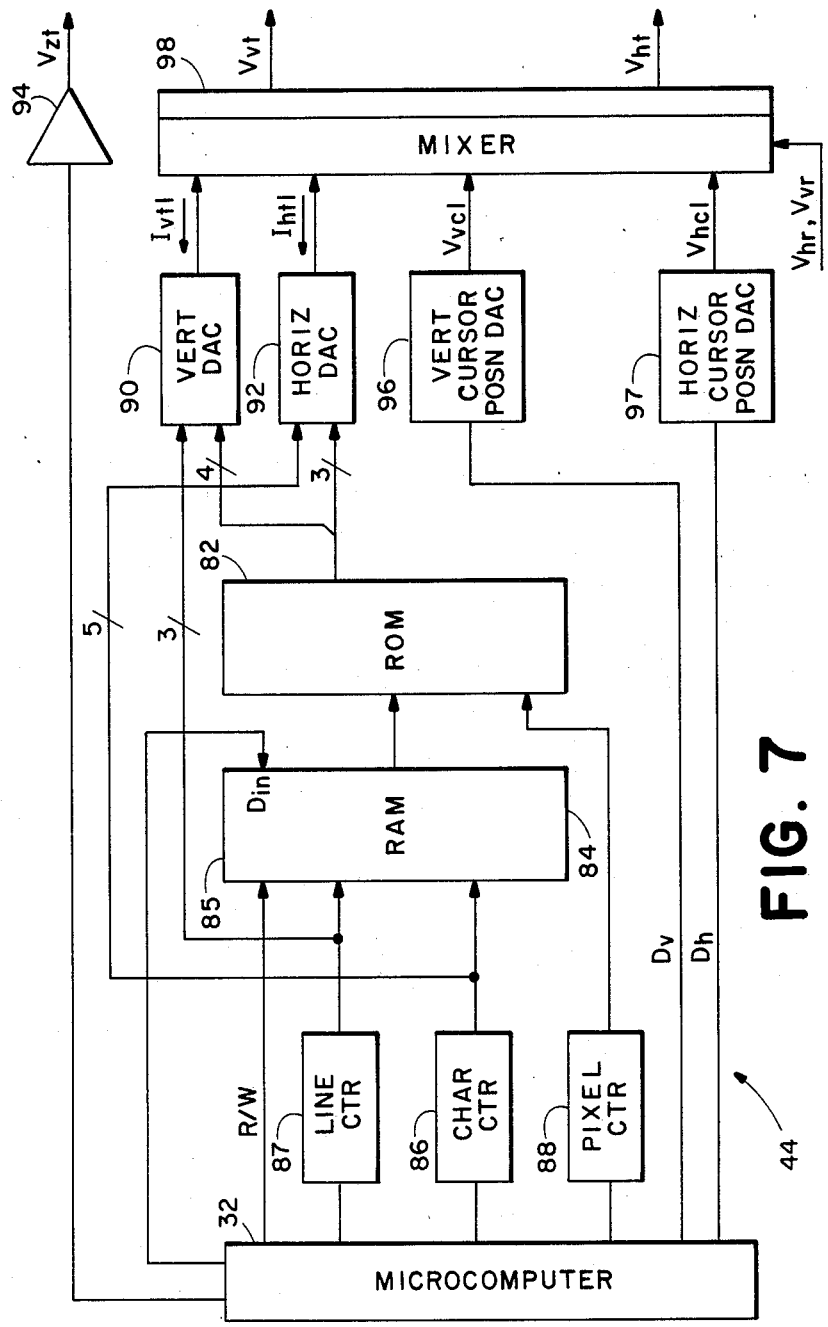
FIG. 7 is a block diagram of the readout control shown in FIG. 3.

FIG. 7 includes a detailed block diagram of readout control circuit 44 and further includes a block representing microcomputer 32. Readout control circuit 44 utilizes a character read only memory (ROM) 82 storing data indicating which set of pixels in an eight pixel by sixteen pixel character cell must be illuminated for each character of the set of possible characters which may be displayed. For each illuminated pixel of each character in the character set, character ROM 82 stores four bits indicating a relative elevation in pixels (0–15) of the pixel from the top pixel row of a character, three bits indicating a relative horizontal displacement in pixels (0–7) of the pixel from the right pixel column of a character, and one bit indicating whether all the illuminated pixels of the character have been updated.

A random access memory (RAM) 84 has an input data port from microcomputer 32 and an output data port connected to address terminals of character ROM 82. Microcomputer 32 generates NEXT LINE and NEXT CHAR signals. A line counter 87 counts occurrences of the NEXT LINE signal and a character counter 86 counts occurrences of the NEXT CHAR signals. Utilizing the count output of character counter 86 as address words, microcomputer 32 writes cursor text data representing the thirty-two characters making up the cursor/cursor text display into consecutive addresses in RAM 84. Also, utilizing both the count output of character counter 86 and the count output of line counter 87, microcomputer 32 writes screen text data representing the thirty-two characters of each line of screen text into consecutive addresses in RAM 84. The addresses correspond to the desired location of the screen text characters on screen 22.

Microcomputer 32 also generates a NEXT PIXEL signal. A pixel counter 88 counts occurrences of the NEXT PIXEL signal, the output of the pixel counter controlling additional address terminals of character ROM 82.

Readout control circuit 44 is disabled when microcomputer 32 is in its waveform display mode. When microcomputer 32 is in its cursor and text display mode, readout control circuit 44 is enabled and functions either in a cursor/cursor text display mode or in screen text display mode, depending on the manner in which RAM 84 is addressed.

In the cursor/cursor text display mode of readout control circuit 44, the cursor 36 and cursor text 38 displayed on screen 22 of FIG. 2, are updated on a character-by-character basis and the display of each character is updated on a pixel-by-pixel basis. The microcomputer 32 generates the NEXT PIXEL signal once for each illuminated pixel in each character, and generates the NEXT CHAR signal once for each character in the row. Line counter 87 is disabled. The NEXT CHAR and NEXT PIXEL signals are synchronized such that a NEXT CHAR signal is generated when NEXT PIXEL signals have been generated for all the illuminated pixels in a character. A complete row of characters is updated when thirty-two successive NEXT CHAR signals have been generated. The thirty-two successive character counts address the locations in RAM 84 into which the cursor text data was written by microcomputer 32. RAM 84 converts the character count to output data which addresses an area in character ROM 82 wherein the data for the character to be displayed is stored. The pixel count produced by pixel counter 84 addresses the storage location of data for the particular pixel to be displayed.

In the screen text display mode, line counter 87 is enabled and microcomputer 32 generates the NEXT LINE signal once for each line of characters, the NEXT LINE and NEXT CHAR signals being synchronized such that thirty-two NEXT CHAR signals are generated for each NEXT LINE signal.

The levels within screen 22 at which lines of screen text can be displayed are fixed with reference to the horizontal lines of the grid 23. The level at which a particular line of characters is displayed is determined by the line count required to access the data representing that line of characters.

A vertical DAC 90 receives a seven bit input signal, the upper three bits being provided by line counter 87 and the lower four bits provided by character ROM 82. Vertical DAC 90 sinks an output current Ivt1 proportional to the value represented by its seven bit input which indicates the vertical displacement of the pixel being updated. A horizontal DAC 92 receives an eight bit input signal, the lower three bits being provided by character ROM 82 and the upper five bits being provided by character counter 86. Horizontal DAC 92 sinks an output current Iht1 proportional to the value of its input data, which indicates the horizontal displacement of the pixel being updated from the right edge of the oscilloscope screen. A single bit "readout blanking" bit is produced by microcomputer 32 and provides an input to a Z-axis preamplifier 94 which produces the Vzt output signal of readout control circuit 44. When the readout blanking bit is high, the Vzt signal is high and the pixel being updated is illuminated. When the readout blanking bit is low, Vzt is low and the pixel is not illuminated. The vertical cursor position data Dv produced by microcomputer 32 is converted by a vertical cursor position DAC 96 to a vertical cursor position voltage Vvcl of magnitude proportional to the vertical cursor position data, and the horizontal cursor position data Dh produced by microcomputer 32 is converted by a horizontal cursor position DAC 97 to a horizontal cursor position voltage Vhcl of magnitude proportional to the horizontal cursor position data. The Ivt1, Iht1, Vvcl and Vhcl signals produced by DACs 90, 92, 96 and 97, along with constant reference voltages Vvr and Vhr, provide inputs to a mixer circuit 98 which supplies the Vvt and Vht output signals of readout control circuit 44 in response to its input signals.

Figure 8:
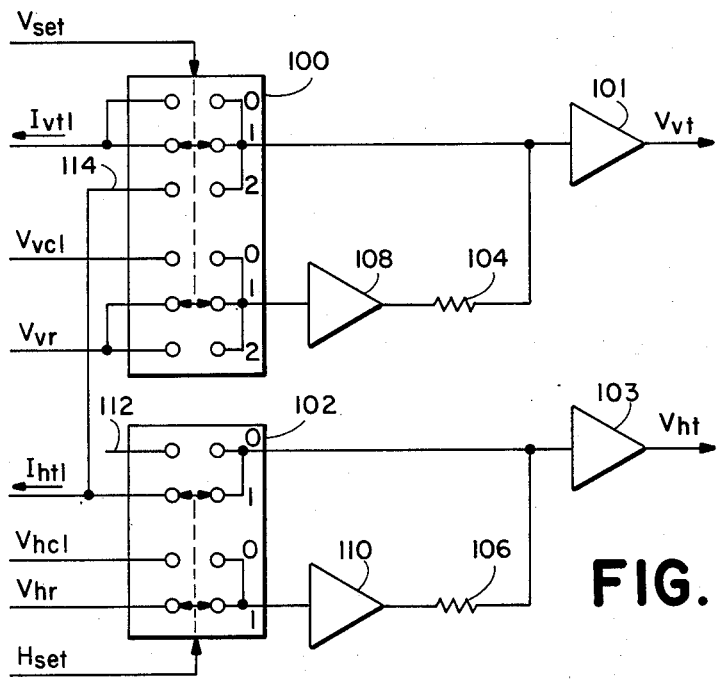
FIG. 8 is a block diagram of the mixer shown in FIG. 7.

Mixer circuit 98 is shown in FIG. 8 and comprises multiplexers 100 and 102. Each multiplexer is illustrated as having an upper half and a lower half. Multiplexer 100 has three settings, whereas multiplexer 102 only requires two settings. The setting of multiplexer 100 is controlled by a signal Vset received from microcomputer 32, and the setting of multiplexer 102 is controlled by a signal Hset received from microcomputer 32. The upper half of multiplexer 100 receives the Ivt1 and Iht1 signals produced by DACs 90 and 92, whereas the upper half of multiplexer 102 receives only the Iht1 signal. The lower half of multiplexer 100 receives the Vvcl and Vvr signals and the lower half of multiplexer 102 receives the Vhcl and Vhr signals.

Mixer 98 has three distinct modes of operation. When readout circuit 44 is in the screen text display mode (in which both character ROM 82 and line counter 87 provide signals to vertical DAC 90), mixer 98 also is in the screen text display mode, multiplexer 100 has setting 1 and multiplexer 102 has setting 1. Ivt1 flows through the upper half of multiplexer 100 and is returned to Vvr through resistor 104. The value of Vvr represents the voltage required at the input of amplifier 101 to place the light dot at the top of the CRT screen. Therefore, the voltage at the input of amplifier 101 is offset from Vvr in dependence on the magnitude of Ivt1. The minimum value of Ivt1 is zero, and its maximum value produces a sufficient voltage drop across resistor 104 to place the light dot at the bottom of screen 22. The voltage Vvt produced by amplifier 101 therefore varies, in accordance with the value of Ivt1, between the voltage required to position the light dot at the top of the screen and the voltage required to position the light dot at the bottom of the screen. In the screen text display mode, current Iht1 flows through the upper half of multiplexer 102 and is returned to Vhr through resistor 106. The value of Vhr represents the voltage required at the input of amplifier 103 to place the light dot at the right side of the screen. The minimum value of Iht1 is zero, and its maximum value produces a sufficient voltage drop across resistor 106 to place the light dot at the left of the screen. Consequently, the voltages Vvt and Vht are independent of cursor position and are able to address all pixels of screen 22.

When readout control circuit 44 is in the cursor/cursor text display mode (in which line counter 87 is disabled and accordingly vertical DAC 90 receives its input only from character ROM 82) mixer 98 may be in the horizontal cursor mode or the vertical cursor mode. In the horizontal cursor mode, multiplexer 100 is in setting 0 and multiplexer 102 is in setting 1. The current Ivt1 provided by vertical DAC 90 flows through the upper half of multiplexer 100 and is returned to Vvcl through resistor 104 and buffer 108. Accordingly, the voltage drop produced across resistor 104 is from voltage Vvcl instead of from Vvr and for a given value of Ivt1 the value of Vvt depends on the value of Vvcl. The setting of multiplexer 102 is the same as for the screen text mode. Consequently, in the horizontal cursor mode a line of text is produced, and the vertical position of the text depends on the level of voltage Vvcl. Since underlining is provided for all characters and positions in the line, the underlinings merge to provide a horizontal cursor and the displayed characters provide cursor text of which the vertical position changes with the vertical position of the cursor.

The value of Vvcl (proportional to the cursor vertical position data) determines the vertical position of the cursor by setting the vertical position on the screen of the top row of pixels of each character, the cursor appearing 14 pixels therebelow. The value of Ivt1 determines the vertical displacement (in pixels) of the pixel presently being updated from the top pixel row of the character. When Ivt1 is zero, the drop across resistor 104 is zero, the input to amplifier 101 is at the level of Vccl, and the value of Vvt is such that the electron beam addresses a pixel in the top row of a character. As Ivt1 is increased to a maximum value, Vvt decreases to a minimum. The value of resistor 104 is such that when the higher order bits provided to DAC 90 are all zero and the lower order bits are all one, Vvt is at a value which positions the beam at the bottom pixel row of the character.

In the vertical cursor mode, multiplexer 100 is in setting 2 and multiplexer 102 is in setting 0. The current Ivt1 has no effect on the output of the mixer. The current Iht1 is applied to the upper half of multiplexer 100 by way of its input 114 and is returned to Vvr. The data provided to RAM 84 by microcomputer 32 defines each of the thirty-two characters as being an underline. Accordingly, the current Iht1 ramps from 0 to its maximum value. A voltage ramp is generated at Vout. Since no current flows through the upper half of multiplexer 102, the value of Vht depends only on the value of Vhcl. Consequently, a vertical line, whose horizontal position is controlled by Vhcl, is displayed.

The buffers 108 and 110 prevent on resistance of multiplexers 100 and 102 from affecting the cursor position.

The value of the horizontal reference voltage Vhr is set such that when Iht1 is zero, the value of Vht produced by amplifier 103 is appropriate to position the beam on a pixel along the right edge of the screen. As Iht1 is increased, the voltage drop across resistor 106 increases, decreasing Vht so as to move the beam to the left. The value of resistor 106 is selected such that when Iht1 is a maximum, Vht is at a value which positions the beam along the left edge of the screen.

Thus as has been described hereinabove, vertical, horizontal, and Z-axis control signals (Vvt, Vht, and Vzt) produced by the readout control circuit 44 are respectively multiplexed with the output signal Vin' of the vertical preamplifier 48, the sweep signal Vswp, and the Z-axis control signal Vz so that the readout control circuit may cause the beam to form a cursor on an oscilloscope screen at a vertical level controlled by cursor vertical position data provided by microcomputer 32 and to form characters on the screen indicating the parameter represented by the cursor.

It will be appreciated that the present invention is not restricted to the particular embodiment that has been described and illustrated, and that variations may be made therein without departing from the scope of the invention as defined in the appended claims and equivalents thereof. For example, the cursor 36 may be displayed in a form other than a line across the oscilloscope screen, such as a short arrow pointing to a position on the screen, by appropriately choosing pixels to be illuminated. In the event that the oscilloscope's user interface employs icons (non-alphanumeric symbols) to designate parameters, these icons may be stored in character ROM 82, and a stored icon may then be used for labelling a cursor in the event that the cursor represents the parameter designated by the icon. Also, the parameter represented by the cursor may be user-defined and the user may select an appropriate label, utilizing the character set stored in ROM 82, to associate with the cursor. Although only a single line of cursor text is displayed in the horizontal cursor mode, if the line counter 87 were not disabled a full screen of text could be displayed, with its vertical position controllable in accordance with the value of Vvcl. In general, of course, only a portion of the screen of text would be seen. It is possible to display cursor text in conjunction with vertical cursors by supplying the current Ivt1 to the unused input of multiplexer 102 and storing a second character set in the character ROM 82, this second character set being rotated ninety degrees from the character set used to generate the cursor/cursor text display. Alternatively, the current Iht1 could be applied to the unused input 112 of the multiplexer 102 instead of to input 114 of multiplexer 100, and the current Ivt1 applied to input 114 of the upper half of multiplexer 100. In this case, if a second character set were stored in which the characters had vertical lines at the side instead of underlining, and the characters were vertically aligned by placing multiplexer 100 in setting 2, the vertical lines of the separate characters would merge to form a cursor.

We claim:

1. An oscilloscope comprising:
a display screen,
means for generating a visually distinct dot on the display screen,
first deflection means for receiving a signal representative of a first quantity and deflecting the dot along a first of two orthogonal axes in dependence upon the value of the first quantity,
second deflection means for receiving a signal representative of a second quantity and deflecting the dot along a second of the two orthogonal axes in dependence upon the value of the second quantity, and
cursor display means for applying signals to the first and second deflection means for causing the deflection means additionally to deflect the light dot to selected positions along said axes to generate an auxiliary display of a marker at a selected location along said first axis, said cursor display means comprising:
a memory in which data representing the configuration of the marker is stored;
output means for receiving the data stored in the memory and generating at least one current signal representative thereof and for providing a voltage signal representative of the location of the auxiliary display along said first axis, and
mixer means for receiving said one current signal and said voltage signal and combining said one current signal with said voltage signal by returning the current signal to the voltage level of said voltage signal through a resistor, whereby an output voltage is developed which depends both on the magnitude of said one current signal and on the magnitude of said voltage level and the location of the auxiliary display along said first axis may be selectively adjusted by adjusting said voltage signal.

2. An oscilloscope according to claim 1, wherein the memory stores the data representing the configuration of the marker in digital form, and said output means comprise a digital-to-analog converter.

3. An oscilloscope according to claim 1, wherein said output means comprise a digital-to-analog converter for receiving a digital signal representative of the location of the auxiliary display and providing said voltage signal in response thereto.

4. An oscilloscope according to claim 1, wherein the memory stores the data representing the configuration of the marker in digital form, and said output means comprise a first digital-to-analog converter which receives a first digital input signal composed of lower order bits provided by the memory and higher order bits and provides a first analog signal in response thereto, the lower order bits of the first digital signal being representative of the positions within a character cell of pixels of the auxiliary display in directions along said first axis and the higher order bits of the first digital signal being representative of the position of the character cell relative to an origin in a direction along said first axis, and said output means also comprise a second digital-to-analog converter, which receives a second digital input signal composed of lower order bits provided by the memory and higher order bits and provides a second analog signal in response thereto, the lower order bits of the second digital signal being representative of the positions within the character cell of pixels of the auxiliary display in directions along said second axis and the higher order bits of the second digital signal being representative of the position of the character cell relative to said origin in a direction along said second axis.

5. An oscilloscope according to claim 1, wherein the memory stores the data representing the configuration of the marker in digital form, and the output means comprise digital-to-analog converter means which receive at least one digital signal provded by the memory and representing the positions within a character cell of pixels of the auxiliary display in directions along said first and second axes, and also receives at least one digital signal that represents the position of the character cell along said first and second axes relative to an origin and generates said one current signal and a second current signal, representative respectively of the positions of the pixels of the auxiliary display along said first and second axes relative to said origin.

6. An oscilloscope according to claim 5, wherein the output means comprise second digital-to-analog converter means which receive at least one digital signal and generate said voltage signal in response thereto, and the origin is defined jointly by the voltage signal provided by the second digital-to-analog converter means and a second voltage signal.

7. An oscilloscope according to claim 1, wherein the marker is a line that extends parallel to one of the first and second axes and is movable in directions parallel to the other of the first and second axes.

8. An oscilloscope according to claim 1, wherein the cursor display means have a mode of operation in which they apply signals to the first and second deflection means for causing the deflection means additionally to deflect the light dot to selected positions along said axes to generate a display of a second marker, and the mixer means are operable to adjust the location of the display of the second marker.

9. An oscilloscope according to claim 1, wherein the auxiliary display includes a representation of an information-conveying symbol adjacent said marker.

10. An oscilloscope comprising:
a display screen,
means for generating a visually distinct dot on the display screen,
first deflection means for receiving a signal representative of a first quantity and deflecting the dot along a first of two orthogonal axes in dependence upon the value of the first quantity,
second deflection means for receiving a signal representative of a second quantity and deflecting the dot along a second of the two orthogonal axes in dependence upon the value of the second quantity,
cursor display means for applying signals to the first and second deflection means for causing the deflection means additionally to deflect the light dot to selected positions along said axes to generate an auxiliary display of a marker at a selected location along said first axis said cursor display means comprising:
a memory in which data representing the configuration of the marker is stored;
first means, which receive a first input signal composed of a lower order component provided by the memory and a higher order component and provide a first analog signal in response thereto, the lower order component of the first input signal being representative of the positions within a character cell of pixels of the auxiliary display in a direction along said first axis and the higher order component of the first input signal being representative of the position of the character cell in a direction along said first axis;
second means, which receive a second input signal composed of a lower order component provided by the memory and a higher order component and provide a second analog signal in response thereto, the lower order component of the second input signal being representative of the positions within the character cell of pixels of the auxiliary display in a direction along said second axis and the higher order component of the second input signal being representative of the position of the character cell in a direction along said second axis;
third means for providing a third analog signal, which is representative of the location of the auxiliary display; and
mixer means for receiving said third analog signal and combining it with said first analog signal to provide a first deflection signal, receiving the second analog signal and providing a second deflection signal therefrom, and applying the first and second deflection signals to the first and second deflection means respectively, whereby the location of the auxiliary display along said first axis may be selectively adjusted by adjusting said third analog signal.

11. An oscilloscope according to claim 10, wherein said first means comprise a first digital-to-analog converter which receives a first digital input signal composed of lower order bits provided by the memory and higher order bits and provides said first analog signal in response thereto, said second means comprise a second digital-to-analog converter which receives a second digital input signal composed of lower order bits provided by the memory and higher order bits and provides said second analog signal in response thereto, and said third means comprise a third digital-to-analog converter which receives a third digital signal representative of the location of the auxiliary display and provides said third analog signal in response thereto.

12. An oscilloscope according to claim 10, wherein said third analog signal is a voltage signal that represents the location of the auxiliary display along said first axis and the first analog signal is a current signal, and the mixer means combine the third analog signal with the first analog signal by returning the current signal to the voltage level of the voltage signal through a resistor whereby an output voltage is developed that is dependent both on the magnitude of said current signal and on the magnitude of said voltage level.

13. An oscilloscope according to claim 12, comprising fourth means for providing a fourth analog signal, which is representative of the location of the auxiliary display in a direction of along said second axis, the fourth analog signal being a second voltage signal, and the mixer means combine the second current signal with the second voltage signal by returning the second current signal to the voltage level of the second voltage signal through a second resistor, whereby an output voltage is developed that depends both on the magnitude of said second current signal and on the magnitude of the voltage level of said second voltage signal.

14. An oscilloscope according to claim 10, wherein the marker is a line that extends parallel to one of the first and second axes and is movable in directions parallel to the other of the first and second axes.

15. An oscilloscope according to claim 10, wherein the cursor display means have a mode of operation in which they apply signals to the first and second deflection means for causing the deflection means additionally to deflect the light dot to selected positions along said axes to generate a display of a second marker, and the mixer means are operable to adjust the location of the display of the second marker.

16. An oscilloscope according to claim 10, wherein the auxiliary display includes a representation of an information-conveying symbol adjacent said marker.

17. An oscilloscope comprising:
a display screen,
means for generating a visually distinct dot on the display screen,
first deflection means for receiving a signal representative of a first quantity and deflecting the dot along a first of two orthogonal axes in dependence upon the value of the first quantity,
second deflection means for receiving a signal representative of a second quantity and deflecting the dot along a second of the two orthogonal axes in dependence upon the value of the second quantity,
cursor display means for applying signals to the first and second deflection means for causing the deflection means additionally to deflect the light dot to selected positions along said axes to generate an auxiliary display of a marker at a selected location along one of said axes, said cursor display means comprising:
a memory in which data representing the configuration of the marker is stored;
output means which receive at least one signal provided by the memory and representing the positions within a character cell of pixels of the auxiliary display in directions along said first and second axes, and also receive at least one signal that represents the position of the character cell along said first and second axes relative to an origin defined by first and second voltage signals and generates first and second current signals representative of the positions of the pixels of the auxiliary display along said first and second axes respectively relative to said origin; and
multiplexer means for receiving the first voltage signal and the first current signal and combining them by returning the first current signal to the voltage level of the first voltage signal through a first resistor whereby a first voltage is developed that represents the positions of the pixels of the auxiliary display relative to said origin along said first axis, and for receiving the second voltage signal and the second current signal and combining them by returning the second current signal to the voltage level of the second voltage signal through a second resistor, whereby a second voltage is developed that represents the positions of the pixels of the auxiliary display relative to said origin along said second axis.

18. An oscilloscope according to claim 17, wherein the memory stores the data representing the configuration of the marker in digital form, and the output means comprise digital-to-analog converter means which receive at least one digital signal provided by the memory and also receive at least one digital signal that represents the position of the character cell relative to said origin, and generates said first and second current signals in response thereto.

19. An oscilloscope according to claim 18, comprising second digital-to-analog converter means for providing at least one of said first and second voltage signals.

20. An oscilloscope according to claim 18, wherein said digital-to-analog converter means comprise a first digital-to-analog converter that receives a digital input signal having lower order bits representative of the positions within a character cell of pixels of the auxiliary display in directions along said first axis and having higher order bits representative of the position of the character cell along said first axis, and also comprises a second digital-to-analog converter that receives an additional input signal having lower order bits representative of the positions within the character cell of pixels of the auxiliary display in directions along said second axis and having higher order bits representative of the position of the character cell along said second axis.

21. An oscilloscope according to claim 17, comprising reference voltage means for providing first and second reference voltages representative of the maximum deflections of the light dot along said first and second axes respectively, and wherein the multiplexer means have a first setting in which the first current signal is returned to the level of the first voltage signal and a second setting in which the first current signal is returned to the level of the first reference voltage.

22. An oscilloscope according to claim 21, wherein the multiplexer means have a setting in which the second current signal is returned to the level of the second voltage signal and a further setting in which the second current signal is returned to the level of the second reference voltage.

23. An oscilloscope according to claim 17, wherein the marker is a line that extends parallel to one of the first and second axes and is movable in directions parallel to the other of the first and second axes.

24. An oscilloscope according to claim 17, wherein the cursor display means have a mode of operation in which they apply signals to the first and second deflection means for causing the deflection means additionally to deflect the light dot to selected positions along said axes to generate a display of a second marker, and the multiplexer means are operable to adjust the location of the display of the second marker.

25. An oscilloscope according to claim 17, wherein the auxiliary display includes a representation of an information-conveying symbol adjacent said marker.

26. An oscilloscope comprising:
a display screen,
means for generating a visually distinct dot on the display screen,
first deflection means for receiving a signal representative of a first quantity and deflecting the dot along a first of two orthogonal axes in dependence upon the value of the first quantity,
second deflection means for receiving a signal representative of a second quantity and deflecting the dot along a second of the two orthogonal axes in dependence upon the value of the second quantity,
waveform display means for applying first and second signals representative respectively of an independent variable and a dependent variable to the first and second deflection means for causing the deflection means to deflect the light dot to selected positions along said axes to generate a graphical representation of the variation of the dependent variable as a function of the independent variable, and
cursor display means for applying signals to the first and second deflection means for causing the deflection means additionally to deflect the light dot to selected positions along said axes to generate an auxiliary display of a marker at a selected location along one of said axes, said cursor display means comprising:
a memory in which data representing the configuration of the marker is stored;
output means for receiving the data stored in the memory and generating a current output signal representative thereof and for providing a voltage signal representative of the location of the auxiliary display along said one axis; and
mixer means for receiving the voltage signal and the current signal and combining them by returning the current signal to the voltage level of the voltage signal through a resistor, whereby an output voltage is developed which depends both on the magnitude of said current signal and on the magnitude of said voltage signal and the location of the auxiliary display along said one axis may be adjusted independently of the deflection of the dot along said one axis as a result of a signal applied to the deflection means by the waveform display means.

27. An oscilloscope according to claim 26, wherein the memory stores data representing the configuration of the marker in digital form, and said output means comprise first digital-to-analog converter means for receiving the data stored in the memory and generating said current signal and second digital-to-analog converter means for receiving at least one digital signal representative of the location of the auxiliary display along said one axis and generating said voltage signal in response thereto.

28. An oscilloscope according to claim 26, wherein the marker is a line that extends parallel to one of the first and second axes and is movable in directions parallel to the other of the first and second axes.

29. An oscilloscope according to claim 26, wherein the cursor display means have a mode of operation in which they apply signals to the first and second deflection means for causing the deflection means additionally to deflect the light dot to selected positions along said axes to generate a display of a second marker, and the mixer means are operable to adjust the location of the display of the second marker.

30. An oscilloscope according to claim 26, wherein the auxiliary display includes a representation of an information-conveying symbol adjacent said marker.

31. An oscilloscope comprising:
a display screen,
means for generating a visually distinct dot on the display screen,
first deflection means for receiving a signal representative of a first quantity and deflecting the dot along a first of two orthogonal axes in dependence upon the value of the first quantity,
second deflection means for receiving a signal representative of a second quantity and deflecting the dot along a second of the two orthogonal axes in dependence upon the value of the second quantity,
waveform display means for applying first and second signals representative respectively of an independent variable and a dependent variable to the first and second deflection means for causing the deflection means to deflect the light dot to selected positions along said axes to generate a graphical representation of the variation of the dependent variable as a function of the independent variable, and
cursor display means for applying signals to the first and second deflection means for causing the deflection means additionally to deflect the light dot to selected positions along said axes to generate an auxiliary display of a marker at a selected location along one of said axes, said cursor display means comprising:
a memory in which data representing the configuration of the marker is stored;
output means for receiving at least one signal provided by the memory and representing the positions within a character cell of pixels of the auxiliary display in directions along said first and second axes, and also receiving at least one signal representing the position of the character cell along said first and second axes relative to an origin defined by first and second voltage signals, said output means generating first and second current signals representative of the positions of the pixels of the auxiliary display along said first and second axes respectively relative to said origin; and
multiplexer means for receiving the first and second current signals and returning them to the voltage levels of the first and second voltage signals respectively through respective resistors, whereby voltages are developed that represent the positions of the pixels of the auxiliary display relative to said origin along said first and second axes and the location of the auxiliary display along said one axis may be adjusted independently of the deflection of the dot along said one axis as a result of a signal applied to the deflection means by the waveform display means.

32. An oscilloscope according to claim 31, wherein the memory stores the data representing the configuration of the marker in digital form, and the output means comprise digital-to-analog converter means for receiving at least one digital signal provided by the memory and representing the positions within the character cell of pixels of the auxiliary display along said first and second axes, and also receiving at least one digital signal representing the position of the character cell along said first and second axes.

33. An oscilloscope according to claim 32, further comprising second digital-to-analog converter means for receiving at least one digital signal representative of the location of the auxiliary display and providing at least one of said first and second voltage signals in response thereto.

34. An oscilloscope according to claim 31, comprising reference voltage means for providing first and second reference voltages representative of the maximum deflections of the light dot along said first and second axes respectively, and wherein the multiplexer means have a first setting in which the first current signal is returned to the level of the first voltage signal and a second setting in which the first current signal is returned to the level of the first reference voltage.

35. An oscilloscope according to claim 34, wherein the multiplexer means have a setting in which the second current signal is returned to the level of the second voltage signal and a further setting in which the second current signal is returned to the level of the second reference voltage.

36. An oscilloscope according to claim 31, wherein the marker is a line that extends parallel to one of the first and second axes and is movable in directions parallel to the other of the first and second axes.

37. An oscilloscope according to claim 31, wherein the cursor display means have a mode of operation in which they apply signals to the first and second deflection means for causing the deflection means additionally to deflect the light dot to selected positions along said axes to generate a display of a second marker, and the multiplexer means are operable to adjust the location of the display of second marker.

38. An oscilloscope according to claim 31, wherein the auxiliary display includes a representation of an information-conveying symbol adjacent said marker.

* * * * *